US011545997B2

(12) United States Patent
Kuntschke et al.

(10) Patent No.: US 11,545,997 B2
(45) Date of Patent: Jan. 3, 2023

(54) DEVICE AND METHOD FOR PROCESSING A BINARY-CODED STRUCTURE DOCUMENT

(71) Applicant: SIEMENS AKTIENGESELLSCHAFT, Munich (DE)

(72) Inventors: Richard Kuntschke, Geisenhausen (DE); Andreas Scholz, Unterschleißheim (DE); Daniel Peintner, Meransen Mühlbach (IT)

(73) Assignee: Siemens Aktiengesellschaft, Munich (DE)

( * ) Notice: Subject to any disclaimer, the term of this patent is extended or adjusted under 35 U.S.C. 154(b) by 84 days.

(21) Appl. No.: 16/092,270

(22) PCT Filed: Mar. 28, 2017

(86) PCT No.: PCT/EP2017/057237
§ 371 (c)(1),
(2) Date: Oct. 9, 2018

(87) PCT Pub. No.: WO2017/178222
PCT Pub. Date: Oct. 19, 2017

(65) Prior Publication Data
US 2019/0155875 A1    May 23, 2019

(30) Foreign Application Priority Data

Apr. 12, 2016   (DE) .......................... 102016206046.5

(51) Int. Cl.
*H03M 7/30* (2006.01)
*G06F 40/146* (2020.01)
*G06F 40/143* (2020.01)

(52) U.S. Cl.
CPC .......... *H03M 7/707* (2013.01); *G06F 40/143* (2020.01); *G06F 40/146* (2020.01)

(58) Field of Classification Search
CPC ...... G06F 40/14; G06F 40/146; G06F 40/143; H03M 7/707
See application file for complete search history.

(56) References Cited

U.S. PATENT DOCUMENTS 8,914,718 B2    12/2014 Denoual et al.
9,922,089 B2 *   3/2018 Style .................. G06F 16/86
(Continued)

FOREIGN PATENT DOCUMENTS

CN    1612137 A    5/2005
CN    1744087 A    3/2006
(Continued)

OTHER PUBLICATIONS

Doi, Yusuke, et al. "XML-less EXI with code generation for integration of embedded devices in web based systems." Internet of Things (IOT), pp. 76-83; XP032297313; 3rd International Conference on the. IEEE, 2012.
(Continued)

*Primary Examiner* — Stephen S Hong
*Assistant Examiner* — Nicholas Hasty
(74) *Attorney, Agent, or Firm* — Lempia Summerfield Katz LLC

(57) ABSTRACT

A binary-coded structure document, (e.g., in an EXI format which is based on a structure document designed in a text-based description language, such as XML), is provided with a binary-coded index document, which is based on a structural part of the structure document. A storage representation of the binary-coded index document is stored in a working storage unit of the device, and the binary-coded structure document is stored in a background storage unit
(Continued)

assigned to the device. A processing operation or a request by at least one processing process is carried out by accessing the storage representation of the binary-coded index document via an object interface, and in certain examples, fragments of the binary-coded structure document are loaded into the working storage unit by the object interface. By carrying out processing operations on the binary-coded index document, faster request operations are facilitated in that specific requests may already be processed using the index document BCI without the involvement of the binary-coded structure document.

13 Claims, 2 Drawing Sheets

(56) References Cited

U.S. PATENT DOCUMENTS

| | | |
|---|---|---|
| 2004/0148571 A1* | 7/2004 | Lue ............... G06F 16/9577 715/239 |
| 2005/0097513 A1 | 5/2005 | Pepper et al. |
| 2006/0036631 A1 | 2/2006 | Cheslow |
| 2006/0047732 A1 | 3/2006 | Kudo |
| 2007/0198919 A1 | 8/2007 | Clarke et al. |
| 2008/0059417 A1 | 3/2008 | Yamada et al. |
| 2009/0077009 A1 | 3/2009 | Miszczyk et al. |
| 2010/0083101 A1 | 4/2010 | Denoual et al. |
| 2011/0270862 A1* | 11/2011 | Tamiya ............... G06F 16/81 707/E17.014 |
| 2013/0246906 A1* | 9/2013 | Hamon ............ G06F 40/146 715/234 |
| 2015/0222493 A1* | 8/2015 | Tully ............... G06F 40/146 715/234 |
| 2016/0259764 A1* | 9/2016 | Kamiya ............ G06F 40/146 |
| 2018/0300352 A1* | 10/2018 | Sanchez Ribes ..... G06F 3/1246 |

FOREIGN PATENT DOCUMENTS

| | | |
|---|---|---|
| CN | 1845099 A | 10/2006 |
| CN | 101136033 A | 3/2008 |
| EP | 2690564 A2 | 1/2014 |

OTHER PUBLICATIONS

German Office Action for German Application No. 102016206046. 5, dated Feb. 6, 2017.

Kanne, Carl-Christian, and Guido Moerkotte. "Efficient storage of XML data." In Proceedings of the 16th International Conference on Data Engineering, XP002271299, pp. 1-20, Jun. 16, 1999.

PCT International Search Report dated Jun. 16, 2017 and corresponding to PCT International Application No. PCT/EP2017/057237 filed Mar. 28, 2017.

English/German translation of Chinese Office Action for Chinese Application No. 201780023309 4 dated Oct. 11, 2021.

* cited by examiner

DEVICE AND METHOD FOR PROCESSING A BINARY-CODED STRUCTURE DOCUMENT

The present patent document is a § 371 nationalization of PCT Application Serial No. PCT/EP2017/057237, filed Mar. 28, 2017, designating the United States, which is hereby incorporated by reference, and this patent document also claims the benefit of German Patent Application No. DE 10 2016 206 046.5, filed Apr. 12, 2016, which is also hereby incorporated by reference.

TECHNICAL FIELD

The disclosure relates to a device and a method for processing a binary-coded structure document.

BACKGROUND

In the prior art, text-based description languages for the specification of data formats and the required methods for processing the data are already known. A structure document in the sense of this description includes, at least in part, passages in a description language.

A known description language is »Extensible Markup Language«, (abbreviated as XML), with which hierarchically structured data are described in text form or "plain text". The description language XML is used for the platform-independent exchange of data between computer systems. Due to the textual nature of XML, this is readable both by machines and by human beings.

In order to process, (which includes in particular searching, filtering, manipulating, transforming and querying data), the data contained therein, structure documents prepared in the XML description language may be converted into a storage representation, which in professional practice is also known as an "in-memory" model. A known specification for access to a storage representation of XML documents is the "Document Object Model" or DOM, which provides an object interface for data access by one or more processing processes. The object interface is implemented, for example, as a programming interface or Application Programming Interface (API). The storage representation is, however, several times larger than the associated structure document. For this reason, processing of more extensive structure documents in resource-limited devices, (e.g., devices having limited memory space and/or processing power), may not be possible, or only possible to a restricted extent. Such resource-limited devices include, for example, embedded systems for monitoring, open-loop and close-loop control functions, e.g., in the form of so-called intelligent sensors, in particular in a production line or in a vehicle.

In certain cases, a fast data transfer between devices is necessary, which with a textual description language such as XML is not fully possible. Binary representations of XML are therefore proposed to allow an efficient data transfer. A binary representation of XML known as "Efficient XML Interchange", abbreviated as EXI, requires less transmission bandwidth compared to text-based XML data for data transfer between devices, or general-purpose computer systems.

The advantages of the data exchange format EXI are apparent not only in the data exchange between computer systems suggested by its name, but also in the case of device-internal processing of a binary-coded structure document in resource-limited devices. A device-internal processing of the binary-coded structure document, (e.g., in the EXI format), may prove to be more efficient than the use of the XML format, especially where the data are transferred between devices according to EXI specifications anyway.

For a device-internal processing then, the binary-coded structure document (in an analogous manner to the structure document compiled in a text-based description language, on which this binary-coded structure document is based) is converted into a storage representation, to enable one or more processing processes access to the data of the binary-coded structure document via an object interface. Even a device-internal processing of the binary-coded structure document is subject to limits in resource-limited devices, which necessitates considerations of the size of the storage representation to be weighed against a limited storage capacity of a working memory of the device.

If the storage representation of a structure document exceeds a predetermined size, the associated structure document is curtailed to a permissible size by relinquishing originally planned functionalities. If this option is not feasible, this forces the use of proprietary solutions for a leaner storage representation or alternative processing processes, which need to be designed individually for each specific application. This inevitably means that for new or modified applications, an alternative solution will again need to be developed. This is a disadvantage in relation to the basic objective of a generically applicable solution.

It has also been demonstrated that of the possible processing operations, read operations, in particular, outnumber operations that use write access. In contrast to read operations, in general processing operations data are not only read but also modified, overwritten, or re-arranged. In these read operations, structural read operations on a binary-coded structure document again outnumber read operations in which content is required to be read out. The first-mentioned structural read operations include, in particular, queries relating to a hierarchical relation, a number, or particular categories of elements to be determined within the structure of the underlying structure document. These structural read operations may demand processing of the entire memory representation of a structure document, which is represented, e.g., in a tree structure in the memory representation. In the following for reasons of general validity, all reading and writing operations will be referred to with the general term processing operations.

SUMMARY

The scope of the present disclosure is defined solely by the appended claims and is not affected to any degree by the statements within this summary. The present embodiments may obviate one or more of the drawbacks or limitations in the related art.

The object of the present disclosure is to provide a method, (e.g., in a resource-limited device), which enables processing operations on a storage representation of a binary-coded structure document without the size of the binary-coded structure document exceeding the limits of the resource-limited device.

The disclosure is supported by the central consideration of creating a binary-coded index document, the structure of which is identical to the structure of the binary-coded structure document to be processed, but in contrast to the complete binary-coded structure document it does not contain all of the contents, in other words, for example, no attributes, no value assignment of attributes and no content of elements.

Both documents, the binary-coded structure document and the binary-coded index document, are based on an identical structure document, which is compiled in a text-based description language, e.g., in XML. While the binary-coded structure document is based on the whole content of the structure document, the binary-coded index document is based only on a structural subset of the structure document. The index document contains, so to speak, a binary representation of the bare hierarchical data structure of the elements defined in a tree structure, without the associated contents. Due to this purely structural subset, the binary-coded index document requires an intrinsically smaller amount of storage space than the binary-coded structure document.

The method provides that a storage representation of the binary-coded index document is stored in a working memory of the device, while the binary-coded structure document is stored in a background storage unit assigned to the device.

Processing operations are implemented by at least one processing process with access to the binary-coded index document via an object interface, wherein fragments of the binary-coded structure document are loaded into the working memory by the object interface as required.

The object is also achieved by a computer program product for processing the method. The computer program is processed in a processor or controller, which executes the processing of the method.

The object is further achieved by a device designed in particular for resource-limited processing of a binary-coded structure document.

BRIEF DESCRIPTION OF THE DRAWINGS

In the following, exemplary embodiments and advantages of the disclosure are explained in more detail by reference to the drawings.

DETAILED DESCRIPTION

Figure 1:
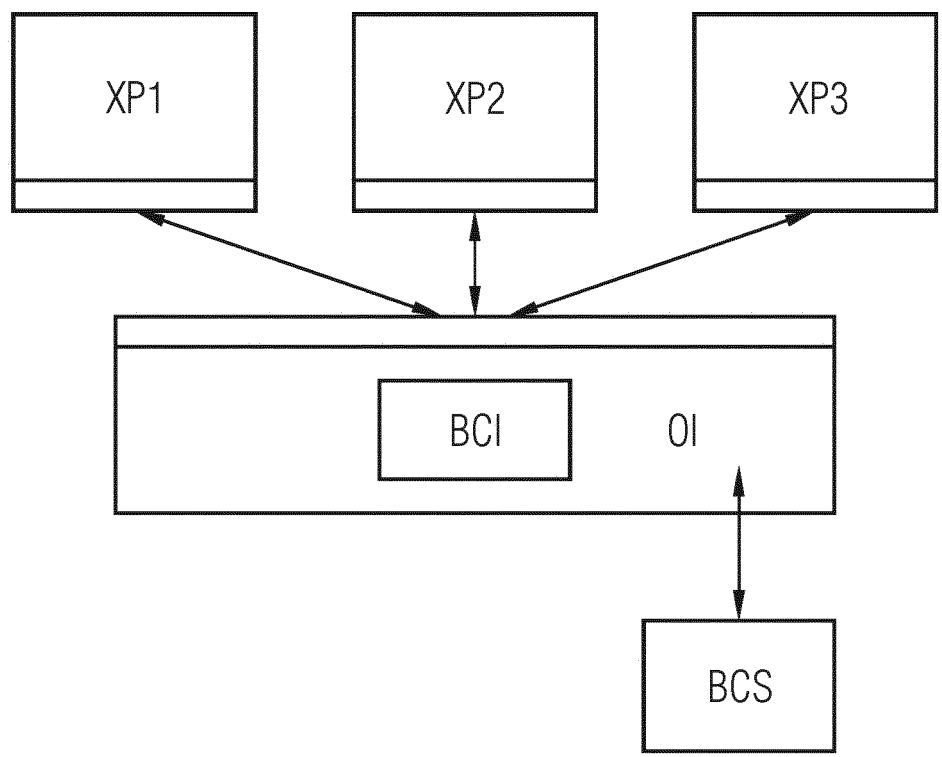
FIG. 1 depicts a schematic structural representation of an example of a processing of a binary-coded structure document in a device.

FIG. 1 depicts a schematic structural representation of a processing of a binary-coded structure document BCS in a device.

In an object interface OI, a storage representation of a binary-coded index document BCI is stored. The object interface OI enables a respective processing process XP1, XP2,XP3 access to the storage representation of the binary-coded index document BCI. The storage representation of a binary-coded index document BCI and the object interface OI is assigned to a working memory of the device.

In a background storage unit of the device, a binary-coded structure document BCS is stored. A storage representation of this binary-coded structure document BCS is loaded into the object interface OI as required.

The processing processes XP1,XP2,XP3 carry out a processing operation on binary-coded structure documents, for example in the EXI format ("Efficient XML Interchange"). This processing includes, in particular, a data searching, filtering, manipulation, transformation, and querying of the data contained in binary-coded structure documents. Examples of these are processing processes (e.g., also referred to in professional practice as "EXI processors") based on the query or transformation languages XPath, XQuery, XSLT, etc.

Due to the possibility of processing the binary-coded structure document BCS in interaction with the binary-coded index document BCI, the disclosure advantageously allows the use of the transformation language XQuery instead of the restricted query language XPath. The capabilities of the transformation language XQuery exceed those of a simple query. It is a Turing-complete language with extensive transformation capabilities, which far exceed the query and filter capabilities of XPath. The query language XPath by contrast offers only a subset of the capabilities of XQuery.

The following description of the figures makes further reference to the functional units of FIG. 1. Identical reference numbers in different figures represent the identical functional units.

Figure 2:
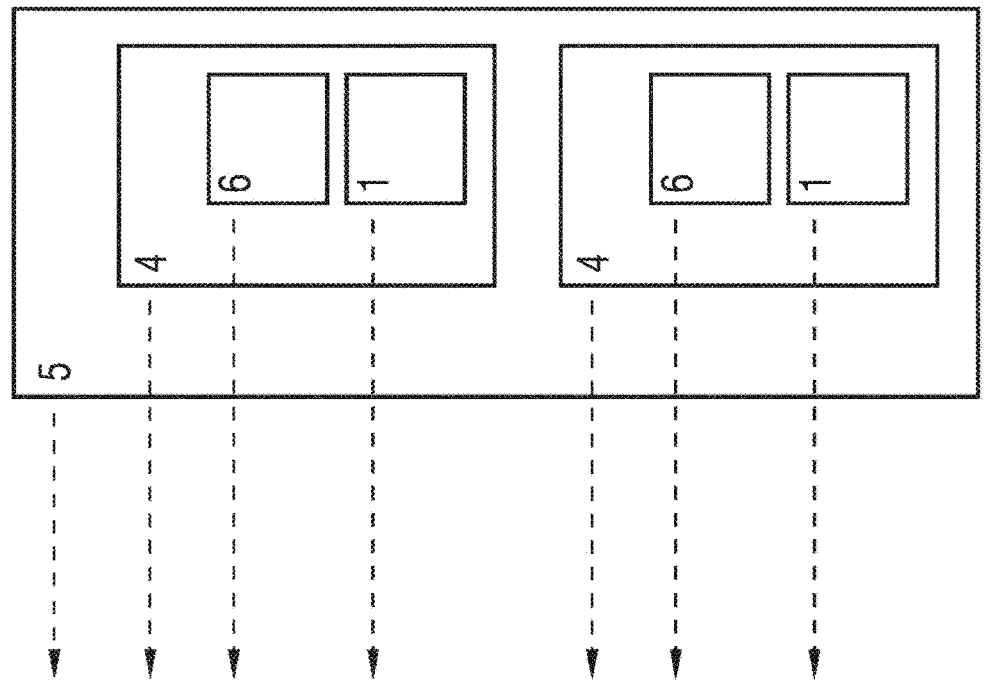
FIG. 2 depicts a schematic representation of an example of a structure of an index document compared with an underlying structure document compiled in a text-based description language.
Figure 2:
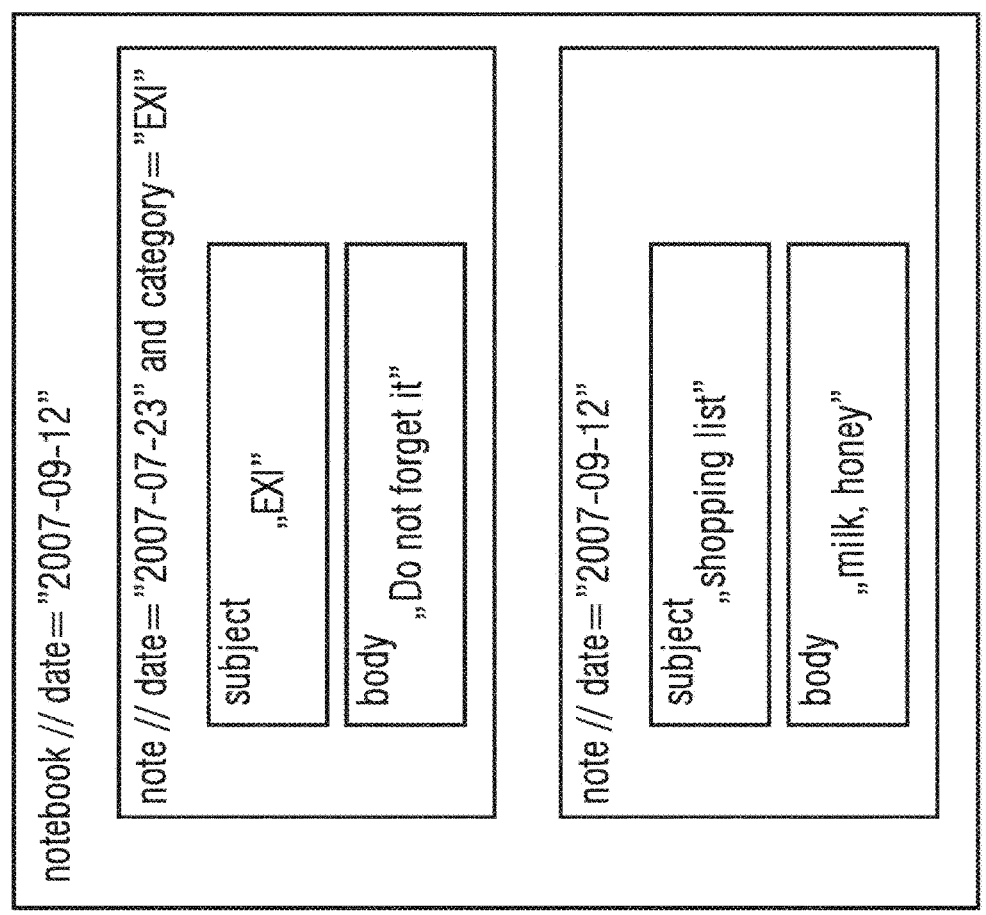

FIG. 2 depicts a schematic representation of a structure of the index document BCI compared with an underlying structure document SD compiled in a text-based description language, here XML.

The example structure document SD shown in the left-hand half of the diagram in structural blocks is based on the following XML code:

```
<?xml version="1.0" encoding="UTF-8"?>
<notebook date="2007-09-12">
    <note date="2007-07-23" category="EXI">
        <subject>EXI</subject>
        <body>Do not forget it!</body>
    </note>
    <note date="2007-09-12">
        <subject>shopping list</subject>
        <body>milk, honey</body>
    </note>
</notebook>
```

This is an XML representation of a notebook, which contains two notes. The notes as well as the notebook itself are referenced with a relevant date in an ISO 6601 format of the form YYYY-MM-DD (year-month-day) as an attribute. The first note contains a further attribute, namely a category "EXI". In addition, each note has a "subject" and the actual content or "body".

The left-hand side of the image of FIG. 2 shows the structure document SD containing the XML code shown above in separate structural blocks. The right-hand half of the image shows a schematic representation of a binary-coded index document BCI formed from the structure document SD, which is based on a structural subset of the structure document SD. In the drawing, the respective structural blocks of the binary-coded index document BCI correspond to each of the structural blocks of the structure document SD, as indicated by dashed reference arrows.

In accordance with the standard EXI-coding measures, compact identification numbers or "identifiers" are provided in the binary-coded index document BCI, which replace a character sequence or "string" contained in the structure document SD. If a character string occurs repeatedly in the structure document SD, then in the EXI-coding this string is referenced by the corresponding identifier as a qualified name or "qname". This requires the management of resource tables or "EXI String Tables". In this example, the identifier 5 in the binary-coded index document BCI stands for the qualified name "notebook", the identifier 4 for "note", the identifier 6 for "subject" and the identifier 1 for the qualified name "body".

The binary-coded index document BCI is based on a subset of the XML structure document shown, which in accordance with the embodiment shown here is restricted to the structural index, but does not contain the actual values, in other words, e.g., the content "shopping list" of the subject "subject". The binary-coded index document BCI thus contains a binary representation of the bare hierarchical data structure of the elements defined in the structural blocks, without the associated contents.

In alternative embodiments, in addition to the bare hierarchical data structure the structural subset of the structure document BCI may also include, for example, contents for which requests are frequently required.

The graphical representation in the structural blocks may also be readily be converted into a tree structure, without affecting the structure of the binary-coded index document BCI itself.

In an overwhelming majority of cases, a query (which forms a special case of a processing operation) may already be answered with the binary-coded index document BCI. Such queries include, in particular, queries relating to a hierarchical relation, a number, or particular categories of elements to be determined. Other processing operations, (e.g., modifications or transformations of structural data), may be carried out exclusively by interaction with the binary-coded index document BCI. If such a processing operation involves a modification in the structure of the binary-coded index document BCI, the modification is also performed in the binary-coded structure document BCS by the object interface OI. This provides a consistency between the binary-coded index document BCI (as a structural representation of the binary-coded structure document BCS) and the binary coded BCS structure document. In order to implement the modification by the object interface OI in the binary-coded structure document BCS, fragments of the binary-coded structure document are loaded into the working memory by the object interface OI. The access to values in the binary-coded structure document is carried out via the identification number, which is already known from the binary-coded index document. This measure allows a rapid and random access to the modified values.

The object interface OI is structured, in particular, in accordance with the "Document Object Model" or DOM, which allows data access, for example in the form of a programming interface or API (Application Programming Interface).

From the point of view of the processing processes XP1,XP2,XP3, the object interface OI is addressable just as if it had loaded the complete binary coded structure document BCS. The object interface OI, however, initially only holds the structure information provided in the binary-coded index document BCI in storage, and re-loads parts of the binary-coded structure document BCS as necessary with the aid of the structure information provided in the binary-coded index document BCI.

In the following, two exemplary processing operations are explained with a description of the involvement of the binary-coded index document BCI.

As the subject of a first query, consider the question of how many notes are in the notebook. For example, such a request may be made by one of the processing processes XP1,XP2,XP3 on the basis of the query languages XPath or XQuery, for example using the query syntax: "count(/notebook/note/)". This query may be answered with the exclusive involvement of the binary-coded index document BCI by all the elements with the identification number 4, (which represents the string "note"), being counted.

As the subject of a second query, consider the question how many notes are subject to the category "EXI". Such a query is made in the following query syntax, for example: "count(/notebook/note[@category='EXI'])". This query would trace the two identification numbers of ID 4 and resolve them, in order to verify whether the attribute "category" is present and has the value "EXI". The resolution is made by involving the resource table or "EXI String Table". To check whether one of the attributes "category" has the value of "EXI", in contrast to the above query, however, the binary-coded structure document BCS is invoked, because the contents of the attributes are not included in the structural subset of the binary-coded index document BCI. The object interface OI therefore loads the corresponding fragment of the binary-coded structure document BCS and carries out the check.

The binary-coded structure document BCS, as an actual complete information carrying document, is represented in a compact form by the binary EXI format, and features index jump labels which enable a random access to each element. In order to implement a random access, for example, the "selfContained" property of elements provided for in the EXI specifications is used.

Furthermore, the use of the known replacement of element names by a corresponding identification number in the binary-coded index document BCI also means that the binary-coded index document BCI is kept very lean in comparison to its underlying structure document SD. The limitation to a structural subset while as far as possible omitting values leads to an even greater streamlining of this XIndex, which with the measures may be entirely stored in a working memory.

In order to achieve this random access to selfContained elements of the binary-coded structure document BCS, only the relevant element (which in this context is understood to be the fragment required as needed) of the binary coded structure document BCS is loaded for processing by the object interface OI, hence in an advantageous way not the entire structure document BCS, or a more extensive part of the BCS structure document including any document content located before or after the relevant element.

According to one embodiment, it is provided that the binary-coded index document also includes further, in particular, frequently needed contents and values, in addition to the structural index. A processing of these frequently used contents and values therefore does not require any repeated loading of corresponding fragments of the binary-coded structure document BCS on the part of the object interface OI. Instead, processing of these frequently used contents and values may be performed with the exclusive involvement of the binary-coded index document BCI.

According to one embodiment, an inline entry "<inline/>" is provided in the structure document SD on which the binary-coded index document BCI is based, which indicates that an element tagged as such does not contain a reference but rather a copy of the value from the binary-coded structure document BCS.

An element tagged with an inline entry "<inline/>" in the underlying structure document SD from which the binary-coded index document BCI is generated leads to the element thus tagged, for example: a binary representation of the tagged element, being included in the binary-coded index document BCI making it therefore directly accessible for processing operations without the fragment needing to be loaded into memory from the binary-coded BCS structure document by the object interface OI.

Inline entries prove to be advantageous for speeding up the query processing, but at the cost of the size of the binary-coded index document BCI. Many queries also need certain values in order to be evaluated, e.g., for the evaluation of filter predicates. If these values are present in inline elements of the binary-coded index document BCI, then no access to the BCS binary-coded structure document is required beyond the index. This may be helpful for values which are frequently referenced in query selection predicates.

According to a further embodiment, a ghost entry "<ghost/>" may be provided in the structure document SD underlying the binary-coded index document BCI, which only indicates the existence of an element, but which contains no further information other than this, in particular, no content and/or values. The content itself may be read in as needed via a reference to the binary-coded structure document BCS or else to another binary-coded index document.

An element tagged with a ghost tag "<ghost/>" in the underlying structure document SD from which the binary-coded index document BCI is generated leads to the fact that the element thus tagged is not included in the binary-coded index document BCI, but only a ghost entry for this element instead. The ghost entry entered in the binary-coded index document BCI for this element simply indicates the existence of this element, but not the element and/or its contents themselves. Should this element be required by a processing operation, the element is loaded into memory from the binary-coded structure document BCS by the object interface OI as required.

Elements tagged with a ghost entry allow a streamlined binary-coded index document BCI to be maintained, even in the case of a large underlying structure document SD. This measure allows a partitioning of one or more binary-coded index documents and relocation of such parts of the index as are expected to be rarely needed out of the main memory.

In the following, reference is again made to the above XML representation of the notebook. An EXI representation of the binary-coded index document BCI has the following structure:

```
<?xml version="1.0" encoding="UTF-8"?>
<x:element xmlns:xsi="http://www.w3.org/2001/XMLSchema-instance"
    xsi:schemalocation="http://www.siemens.com/XIndex xindex. xsd
    xmlns:x="http://www.siemens.com/XIndex">
    <notebook/>
    <x:offsetFirstChild>4</x:offsetFirstChild>
    <x:element>
        <note/>
        <x:offset FirstChild>8</x:offsetFirstChild>
        <x:element>
            <subject/>
            <x:offsetNextSiblinq>6</x:offsetNextSiblinq>
        </x:element>
        <x:element>
            <body/>
            <x:offsetNextParentSibling>21</x:offsetNextParentSibling>
        </x:element>
    </x:element>
    <x:element>
        <note/>
        <x:offsetFirstChild>4</x:offsetFirstChild>
        <x:element>
            <subject>
            <x:offsetNextSiblinq>16</x:offsetNextSiblinq>
        </x:element>
        <x:element>
            <body/>
            <x:offsetNextParentSibling>15</x:offsetNextParentSibling>
```

```
        </x:element>
    </x:element>
</x:element>
```

The binary-coded index document BCI may have a "local" offset to the respective next element as a jump label into the actual binary-coded structure document BCS. Due to the different type of the next element in the EXI representation of the binary-coded index document BCI shown above, for the sake of better clarity the elements <offsetNextSibling/>, <offsetNextParentSibling/> and <offsetFirstChild/> are differentiated by name.

There is exactly one of the said offsets for each element, and the differentiation of the different types by name is not technically required. Alternatively, the offset is therefore also designated generically, e.g., as <offsetNextElementInDocumentOrder/>.

An absolute offset, in contrast to the above-described local offset on the other hand, would have the advantage that the number of bytes to be skipped in the binary-coded structure document BCS in order to access the entire relevant element, would have to be determined in one act. In the case of structural or content-related modifications to the data contained in the binary-coded structure document BCS, however, with an absolute offset all subsequent element indices would possibly have to be updated. If a local offset is used, on the other hand, such modifications of an element only require an update in the hierarchy above the element.

Local offsets are used in an advantageous way to be able to skip over an irrelevant part in the case of a query by one of the processing processes XP1,XP2,XP3. For example, a query for "/notebook/note/body" would cause the element <subject> before body to be considered as not relevant and able to be skipped by the offset.

Another example would be a query in the form of "/notebook/editor" which searches for an element "editor" that does not actually exist. Once the query hits upon a <notebook> element, this is immediately skipped, because it does not contain any <editor> element and is therefore irrelevant.

The length of an element to be skipped is calculated according to the following rule:
1. Initialize length with 0
2. Add length to <offsetFirstChild> if present and jump to firstChild index OR if not present
   Add either <offsetNextSibling> OR <offsetNextParentSibling> (one is present) and jump to indicated index
3. Continue act 2. until
   a. if element has children (has begun with <offsetFirstChild>) until each child was completed with <offsetNextParentSibling>;
   b. if element has no children then <offsetNextSibling> contains the length.

The following table lists all the offsets.

TABLE

| AO | | L | OFC | ONS | ONP |
|---|---|---|---|---|---|
| 0 | EXI Header | | | | |
| 1 | SE(notebook) | 74 | 4 | | |
| | AT(date="2007-09-12") | | | | |
| 5 | SE(note) | 35 | 8 | | |
| | AT(category="EXI") | | | | |
| | AT(date="2007-07-23") | | | | |
| 13 | SE(subject) | 6 | | 6 | |

TABLE-continued

| AO | | L | OFC | ONS | ONP |
|---|---|---|---|---|---|
| | CH("EXI") | | | | |
| | EE(subject) | | | | |
| 19 | SE(body) | 21 | | | 21 |
| | CH("Do not forget it!") | | | | |
| | EE(body) | | | | |
| | EE(note) | | | | |
| 40 | SE(note) | 35 | 4 | | |
| | AT(date="2007-09-12") | | | | |
| 44 | SE(subject) | 16 | | 16 | |
| | CH("shopping list") | | | | |
| | EE(subject) | | | | |
| 60 | SE(body) | | | | 15 |
| | CH("milk, honey") | | | | |
| | EE(body) | | | | |
| | EE(note) | | | | |
| 75 | EE(notebook) | | | | |

The labels in the column headers of the table refer to:
AO: Absolute Offset
L: Length in bytes
OFC: Offset to the first child (offsetFirstChild)
ONS: Offset to the next sibling (offsetNextSibling)
ONP: Offset to the next parent (offsetNextParentSibling)

In the table, a start tag of an EXI element is designated by Start Element or SE, the corresponding event at the end tag as an End Element or EE. The attributes of a start tag are entered with AT. The event which the data of an element relate to are designated with Character or CH.

A calculation of the length for notebook[1] gives 74, thus 4+8+6+21+4+16+15.

A calculation of the length for note[1] is 35, thus 8+6+21

A calculation of the length for note[2] results in 35: 4+16+15

A calculation of the length for note[2]/subject[1] gives 16: 16

The implementation of processing operations on the binary-coded index document BCI, which is also referred to as an XIndex, has the following advantages: (1) the method allows faster query processing by allowing certain requests to be processed by the index document BCI itself; (2) significantly reduced memory consumption during the processing of queries, both on resource-limited devices as well as on other computer systems, up to servers; (3) in addition to a query, the method also allows a modification of the data contained in the index document BCI, which originate from the underlying structure document SD data compiled in a text-based description language; (4) as a result, the method provides the already existing data in an efficient form, (e.g. using the EXI format); and (5) the method extends the use of standard technologies such as the transformation language XQuery to resource-limited devices, such as embedded systems, which in contrast to the query language XPath allows a transformation of data using pure queries or filters.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method for processing a binary-coded structure document in a resource-limited device, the method comprising:
    storing a storage representation of a binary-coded index document in a working memory of the device;
    storing the binary-coded structure document in a background storage unit assigned to the device, wherein the binary-coded index document and the binary-coded structure document are derived from a same structure document, wherein the binary-coded structure document is based on the structure document compiled in a text-based description language, wherein the binary-coded index document is based on a structural subset of the structure document, wherein the binary-coded index document contains only a binary representation of a bare hierarchical data structure of elements defined in structural blocks of the structure document, wherein the binary-coded index document, the binary-coded structure document, or both the binary-coded index document and the binary-coded structure document exist in an Efficient-XML-Interchange-Format, wherein the binary representation of the bare hierarchical data structure contained in the binary-coded index document comprises a plurality of numerical identifiers, wherein each numerical identifier is configured to indicate an element of the binary-coded index document corresponding to an element of the binary-coded structure document, and wherein a hierarchy relationship between the plurality of numerical identifiers corresponds to a hierarchy relationship between a plurality of elements of the binary-coded structure document; and
    carrying out processing operations by at least one processing process by accessing the storage representation of the binary-coded index document via an object interface, wherein fragments of the binary-coded structure document are loaded into the working memory by the object interface as required.

2. The method of claim 1, wherein the text-based description language is an extensible markup language.

3. The method of claim 1, wherein, in the binary-coded index document, elements are included, which are directly accessible for processing operations in the binary-coded index document, based on the numerical identifier of the corresponding element in the structure document.

4. The method of claim 1, wherein, in the binary-coded index document, elements are excluded based on the numerical identifier of the corresponding element in the binary-coded index document, and
    wherein the elements are extracted from the binary-coded structure document by the object interface as required and loaded into the working memory.

5. A computer program product stored on a resource-limited device, wherein the computer program product, when executed by a processor on the device, causes the device to:
    store a storage representation of a binary-coded index document in a working memory of the device;

store a binary-coded structure document in a background storage unit assigned to the device, wherein the binary-coded index document and the binary-coded structure document are derived from a same structure document, wherein the binary-coded structure document is based on the structure document compiled in a text-based description language, wherein the binary-coded index document is based on a structural subset of the structure document, wherein the binary-coded index document contains only a binary representation of a bare hierarchical data structure of elements defined in structural blocks of the structure document, wherein the binary-coded index document, the binary-coded structure document, or both the binary-coded index document and the binary-coded structure document exist in an Efficient-XML-Interchange-Format, wherein the binary representation of the bare hierarchical data structure contained in the binary-coded index document comprises a plurality of numerical identifiers, wherein each numerical identifier is configured to indicate an element of the binary-coded index document corresponding to an element of the binary-coded structure document, and wherein a hierarchy relationship between the plurality of numerical identifiers corresponds to a hierarchy relationship between a plurality of elements of the binary-coded structure document; and access the storage representation of the binary-coded index document via an object interface, wherein fragments of the binary-coded structure document are loaded into the working memory by the object interface as required.

6. A device for a resource-limited processing of a binary-coded structure document, the device comprising:

a background storage unit assigned to the device for storing the binary-coded structure document, the structure document being based on a structure document compiled in a text-based description language;

a working memory for storing a binary-coded index document based on a structural subset of the structure document, wherein the binary-coded index document and the binary-coded structure document are derived from a same structure document, wherein the binary-coded structure document is based on the structure document compiled in a text-based description language, wherein the binary-coded index document is based on a structural subset of the structure document, wherein the binary-coded index document contains only a binary representation of a bare hierarchical data structure of elements defined in structural blocks of the structure document, wherein the binary-coded index document, the binary-coded structure document, or both the binary-coded index document and the binary-coded structure document exist in an Efficient-XML-Interchange-Format, wherein the binary representation of the bare hierarchical data structure contained in the binary-coded index document comprises a plurality of numerical identifiers, wherein each numerical identifier is configured to indicate an element of the binary-coded index document corresponding to an element of the binary-coded structure document, and wherein a hierarchy relationship between the plurality of numerical identifiers corresponds to a hierarchy relationship between a plurality of elements of the binary-coded structure document; and an object interface for access to the binary-coded index document during execution of processing operations by at least one processing process, the object interface being configured for loading fragments of the binary-coded structure document into the working memory as required.

7. The method of claim 2, wherein, in the binary-coded index document, elements are included, which are directly accessible for processing operations in the binary-coded index document, based on the numerical identifier of the corresponding element in the structure document.

8. The method of claim 2, wherein, in the binary-coded index document, elements are excluded based on the numerical identifier of the corresponding element in the binary-coded index document, and wherein the elements are extracted from the binary-coded structure document by the object interface as required and loaded into the working memory.

9. The method of claim 1, wherein the object interface initially only holds structure information provided in the binary-coded index document, and wherein the object interface loads parts of the binary-coded structure document as necessary with aid of the structure information provided in the binary-coded index document.

10. The method of claim 1, wherein the binary-coded structure document comprises index jump labels that enable a random access to each element.

11. The method of claim 1, wherein the numerical identifier is configured to replace a character sequence or string in the structure document.

12. The computer program product of claim 5, wherein the numerical identifier is configured to replace a character sequence or string in the structure document.

13. The device of claim 6, wherein the numerical identifier is configured to replace a character sequence or string in the structure document.

* * * * *